US011429010B1

(12) United States Patent
Puckett et al.

(10) Patent No.: US 11,429,010 B1
(45) Date of Patent: Aug. 30, 2022

(54) SYSTEMS AND METHODS FOR A TUNABLE RADIO FREQUENCY SYNTHESIZER UTILIZING OPTICAL FREQUENCY COMBS

(71) Applicant: Honeywell International Inc., Charlotte, NC (US)

(72) Inventors: Matthew Wade Puckett, Phoenix, AZ (US); Jianfeng Wu, Tucson, AZ (US); Karl D. Nelson, Plymouth, MN (US); Chad Hoyt, Roseville, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/412,002

(22) Filed: Aug. 25, 2021

Related U.S. Application Data

(60) Provisional application No. 63/208,876, filed on Jun. 9, 2021.

(51) Int. Cl.
*G02F 1/11* (2006.01)
*G02F 1/35* (2006.01)
*G02F 2/02* (2006.01)
*H01S 3/00* (2006.01)

(52) U.S. Cl.
CPC .............. *G02F 1/353* (2013.01); *G02F 1/113* (2013.01); *G02F 2/02* (2013.01); *G02F 2203/56* (2013.01); *H01S 3/0057* (2013.01)

(58) Field of Classification Search
CPC . G02F 1/113; G02F 1/353; G02F 2/02; G02F 2203/56; H01S 3/0057
See application file for complete search history.

(56) References Cited

U.S. PATENT DOCUMENTS

| 7,587,144 | B2 | 9/2009 | Ilchenko et al. |
| 7,982,944 | B2 * | 7/2011 | Kippenberg ............. G02F 1/39 372/32 |
| 9,450,673 | B2 | 9/2016 | Vahala et al. |
| 9,905,999 | B2 | 2/2018 | Li et al. |

(Continued)

FOREIGN PATENT DOCUMENTS

EP         3073303 A1 *  9/2016  ......... G02B 6/29338

OTHER PUBLICATIONS

Cizek et al., "Two-Stage System Based on a Software-Defined Radio for Stabilizing of Optical Frequency Combs in Long-Term Experiments", Sensors, Published Jan. 20, 2014, 14, pp. 1757-1770.

(Continued)

*Primary Examiner* — Daniel Petkovsek
(74) *Attorney, Agent, or Firm* — Fogg & Powers LLC

(57) ABSTRACT

Systems and methods for a tunable radio frequency synthesizer utilizing optical frequency combs are provided. In one embodiment, an RF signal generator comprises: an SBS pump laser segment including a first and second SBS pump laser each generating SBS laser light at different respective frequencies; a TE/TM dual comb resonator comprising a comb optical resonator coupled to the first and second SBS pump lasers, wherein the comb optical resonator generates a pair of counter-propagating optical frequency combs of different polarities from the SBS laser light; a filter resonator segment configured to provide feedback to the TE/TM dual comb resonator to lock a relative position of the pair of counter-propagating optical frequency combs, the filter resonator comprising a tunable optical filter to output a discrete tuned RF signal output based on a comb line pair that includes a single comb line from each of the pair of counter-propagating optical frequency combs.

20 Claims, 5 Drawing Sheets

(56) References Cited

U.S. PATENT DOCUMENTS

| | | | |
|---|---|---|---|
| 10,312,658 B2 | 6/2019 | Puckett | |
| 10,451,806 B1 | 10/2019 | Puckett et al. | |
| 10,923,874 B2 * | 2/2021 | Lucas | H01S 3/1053 |
| 2012/0294319 A1 * | 11/2012 | Maleki | G02F 1/39 |
| | | | 372/18 |
| 2013/0271770 A1 * | 10/2013 | Sanders | G01C 19/726 |
| | | | 356/461 |
| 2016/0204571 A1 * | 7/2016 | Wu | G01C 19/72 |
| | | | 359/334 |
| 2019/0278155 A1 * | 9/2019 | Plascak | G02F 1/353 |

OTHER PUBLICATIONS

Jost et al., "Continuosly Tunable, Precise, Single Frequency Optical Signal Generator", Optical Society of America, Optics Express, Jun. 17, 2002, vol. 10, No. 12, pp. 515-520.

Jung et al., "Ultralow Phase Noise Microwave Generation From Mode-Locked Er-Fiber Lasers With Subfemtosecond Integrated Timing Jitter", Article in IEEE Photonics Journal, vol. 5, No. 3, Jun. 2013, pp. 1-8.

Spencer et al., "An Integrated-Photonics Optical-Frequency Synthesizer", Nature 557, May 2018, DOI:10.1038/s41586-018-0065-7, pp. 1-10.

Stern et al, "Battery-operated integrated frequency comb generator", Nature, vol. 562, Oct. 18, 2018, pp. 401-408.

Tan et al., "RF and microwave photonic temporal signal processing with Kerr micro-combs", Advances in Physics: X, vol. 6, No. 1,1838946, Published: Nov. 12, 2020, pp. 1-47.

Tang et al., "Integrated Optoelectronic Oscillator", Optical Society of America, Optics Express vol. 26, No. 9, Apr. 30, 2018, pp. 12257-12265.

* cited by examiner

SYSTEMS AND METHODS FOR A TUNABLE RADIO FREQUENCY SYNTHESIZER UTILIZING OPTICAL FREQUENCY COMBS

CROSS-REFERENCE TO RELATED APPLICATIONS

This application is a U.S. Patent application claiming priority to, and the benefit of, U.S. Provisional Patent Application No. 63/208,876, titled "SYSTEMS AND METHODS FOR A TUNABLE RADIO FREQUENCY SYNTHESIZER UTILIZING OPTICAL FREQUENCY COMBS", filed on Jun. 9, 2021, which is incorporated herein by reference in its entirety.

BACKGROUND

Electronic oscillators are used in many microelectronics systems in the art today. The best microwave oscillators, although capable of extraordinarily low phase noise, are substantial in size. Radio Frequency (RF) signals have been generated using miniaturized oscillator architectures by exploiting optical frequency combs. In these devices, the RF frequency has been fixed at a value corresponding to the free-spectral range of the resonator used to generate it. Such miniaturized oscillator architectures, however, do not provide variable frequency tuning having comparable extraordinarily low phase noise to the larger electronic oscillators.

For the reasons stated above and for other reasons stated below which will become apparent to those skilled in the art upon reading and understanding the specification, there is a need in the art for a systems and methods for a tunable radio frequency (RF) synthesizer utilizing optical frequency combs.

SUMMARY

The Embodiments of the present disclosure provide methods and systems for a tunable radio frequency synthesizer utilizing optical frequency combs and will be understood by reading and studying the following specification.

In one embodiment, an optical radio frequency (RF) signal generator comprises: a Stimulated Brillouin Scattering (SBS) pump laser segment that includes a first SBS pump laser and a second SBS pump laser each generating SBS laser light at different respective frequencies; a TE/TM dual comb resonator segment comprising a comb optical resonator coupled to the first SBS pump laser and the second SBS pump laser, wherein the comb optical resonator generates a pair of counter-propagating optical frequency combs of different polarities from the SBS laser light; and a filter resonator segment configured to provide feedback to the TE/TM dual comb resonator segment to lock a relative position of the pair of counter-propagating optical frequency combs, the filter resonator segment comprising a tunable optical filter configured to output a discrete tuned RF signal output based on a comb line pair in the pair of counter-propagating optical frequency combs that includes a single comb line from each of the pair of counter-propagating optical frequency combs.

DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize features relevant to the present disclosure. Reference characters denote like elements throughout figures and text.

DETAILED DESCRIPTION

Figure 1:
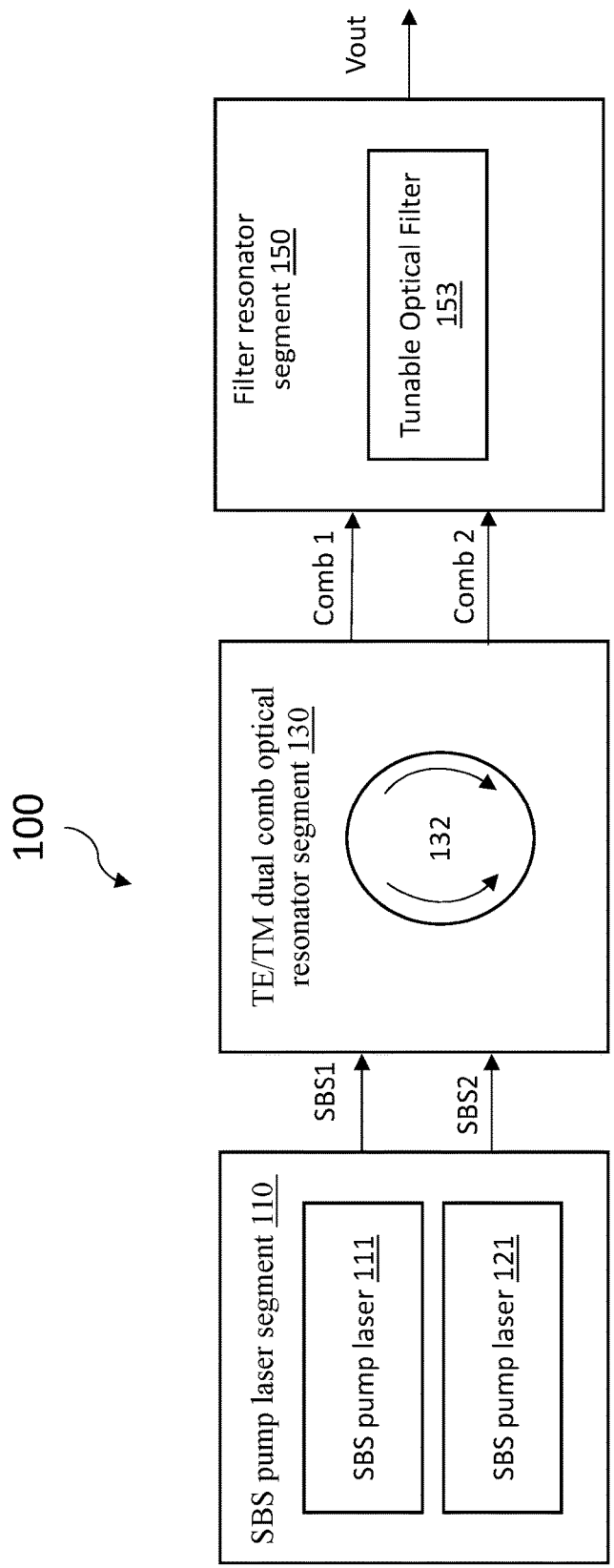
FIG. 1 is a diagram of an example tunable optical RF signal generator embodiment.

In the following detailed description, reference is made to the accompanying drawings that form a part hereof, and in which is shown by way of specific illustrative embodiments in which the embodiments may be practiced. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Currently in the art, quality oscillator having low phase noise is achievable by relatively large, heavy, bulky devices of scale in the order of a square foot or larger. The embodiments described herein provide at least equivalent levels of performance, but in a small form factor. The tunable optical RF signal generator 100 disclosed herein can be used in applications where a small form factor high quality oscillator with low phase noise is needed, such as for small wearable RF transceivers, or any application that could make use of a small optical RF signal generator or oscillator.

In the present disclosure, embodiments for a radio frequency (RF) synthesizer that utilizes optical frequency combs are realized by generating two optical frequency combs in a single resonator. Utilization of this dual-comb resonator comprises pumping one comb of the resonator with a first optical mode (for example, the fundamental transverse electric (TE) mode) and pumping the second comb of the resonator in the counter-propagating direction with a second optical mode (for example, the fundamental transverse magnetic (TM) mode). Due to geometric dispersion, these two mode families will form combs with unequal repetition rates, or equivalently, unequal spectral separations among their lines. When two lines, one from each comb, are then stabilized (i.e., locked) with respect to each other, the combs will yield a range of beat frequencies (for example, increasing from 0 Hz or specified a frequency off-set) corresponding to the locked lines in steps of $f_{rep1}-f_{rep2}$, where $f_{rep1}$ and $f_{rep2}$ are the repetition rates of the first and second combs, respectively. The two combs are combined in a shared physical path and filtered such that a selected beat frequency is produced by a high-speed detector the light is eventually directed into, resulting from the beat between one line of each comb. The present architecture described herein yields a stable beat frequency exhibiting lower phase noise than produced by optical frequency combs controlled via resonance splitting. As discussed below, embodiments of the present disclosure also make use of injection-locked Stimulated Brillouin scattering (SBS) lasers to reduce the phase noise of the optical pump used to generate the combs, and thus obtain extremely low phase noise. It should also be noted that in alternate implementations two combs may optionally be generated from the same mode family to produce a single RF frequency that cannot be tuned, but that may potentially have lower phase noise.

FIG. 1 is a diagram of an example optical RF variable signal generator embodiment, also referred to herein as a tunable optical RF synthesizer, at 100. The tunable optical RF signal generator 100 is described herein in terms of: a low-noise SBS pump laser segment 110, a TE/TM dual comb optical resonator segment 130, and a filter resonator segment 150. It should be understood that although the tunable optical RF synthesizer is described herein in terms of these segments 110, 130 and 150, this is for the purpose of illustration. It should be understood that the features and elements described for each segment may be combined or integrated in various combinations to implement hardware realization of the embodiments.

Before going into further detail about the composition of the three segments of the tunable optical RF signal generator 100, the general principle of operation for producing optical combs is described.

When the tunable optical RF synthesizer 100 is in operation, light exists within its TE/TM dual comb resonator segment 130 in the time domain as a series of pulses, and in the frequency domain as a series of lines (also referred to as spikes or teeth) where the spacing between the lines is uniform. An optical frequency comb is generated in the TE/TM dual comb resonator segment 130 by injecting via a coupler a single frequency laser light into its optical resonator 132 that propagates in a given direction (for example, in the clockwise (CW) direction). For a low loss (i.e. high quality) resonator that has a third order optical non-linearity, the non-linear coefficient of the resonator 132 compresses the propagating light into a soliton pulse that travels around the resonator 132 in the propagation direction. That is, laser light propagating in the CW direction produces a soliton pulse that travels around the resonator in the CW direction. Similarly, laser light propagating in the counter-clockwise (CCW) direction produces a soliton pulse that travels around the resonator in the CCW direction. Each time a soliton pulse passes through a coupler, a portion of the soliton pulse will periodically exit the resonator 132 at a rate corresponding to the round trip time of the resonator 132. In the frequency domain, this corresponds to an output where the lines of the comb being separated by the free spectral range (FSR) of the resonator 132. When that high frequency comb output is sent to an optical sensor, the sensor will measure the pulse repetition or FSR and produce a very narrow low phase noise electrical signal in the RF domain with a frequency corresponding to the FSR of the optical resonator. With embodiments of the present disclosure, the tunable optical RF signal generator 100 utilizes dual counterpropagating optical frequency combs to produce an RF electrical signal output that is not fixed at the FSR of the optical resonator 132, but that instead can be controlled to dynamically scan a range of frequencies (for example, from 1 GHz to 40 GHz).

Figure 2:
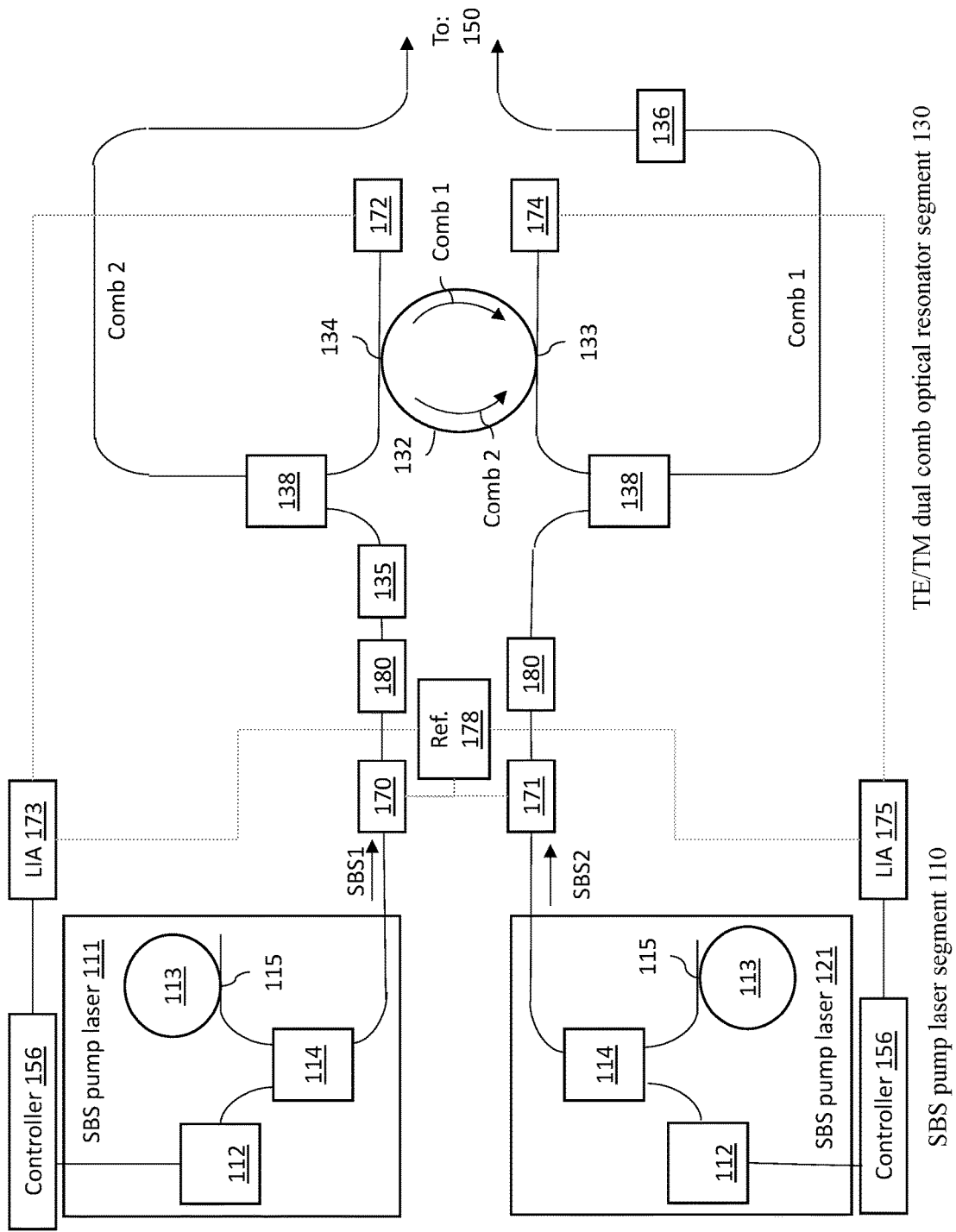
FIG. 2 is a diagram of example an SBS pump laser segment and TE/TM dual comb optical resonator segment for a tunable optical RF signal generator embodiment.

The optical RF signal generator 100 includes a low-noise SBS pump lasers segment 110 that comprising a pair of SBS pump lasers (shown at 111 and 121) each generating SBS laser light (SBS1 and SBS2) at different respective frequencies. As illustrated in FIG. 2, each of the SBS pump lasers 111, 121 comprises a laser light source 112, a pump optical resonator 113, a Bragg grating add-drop filter 114 coupled to the laser light source 112, and a pump optical resonator 113 couple to the Bragg grating add-drop filter 114. Laser light source 112 may comprise a laser diode, such as but not limited to distributed feedback (DFB) laser diodes, or other laser light generating devices. The laser light source 112 for each of the SBS pump lasers 111, 121 establishes an injection lock where the transmission spectrum of the pump optical resonator 113 provides optical feedback that propagates back into the laser light source 112 so that the emission wavelength of the laser light source 112 naturally locks to one of the resonance frequencies of the pump optical resonator 113.

Upon startup, the laser light sources 112 are not yet functioning as lasers, but instead are producing a spontaneous emission. That spontaneous emission propagates out from the respective laser light source 112 into the add-drop filter 114. The spontaneous emission will hit that filter and a portion (within the filter stop band) will diffract and come out of the filter and coupled by coupler 115 into the optical resonator 113. The balance will pass through the add-drop filter 114. Of the diffracted portion of the spontaneous emission, at least a portion of that light will be of a frequency band aligned with a resonance frequency of the optical resonator 113. This will result in the portion of the light on-residence to propagate (for example, CCW), which will produce more backscattering within the optical resonator 133 in the opposite direction (for example, CW) that will come out of the optical resonator 113 at the coupler 115 and back to the add-drop filter 114, and again diffract from the filter's Bragg grating, creating backscattering back into the light source 112. As a result, light re-entering the laser light source 112 corresponds to a single resonance of its respective ring resonator 113. This backscattering feedback into the light source 112 provides a feedback that sets the lasing frequency for that SBS pump laser. Moreover, within the waveguide of the pump optical resonator 113 a counter propagating Brillouin scattering gain occurs that creates optical gain at a set frequency offset (a slightly longer wavelength) from the established laser light source lasing frequency. Because this light is outside of the stop-band of the add-drop filter 114 Bragg grating, it will pass through the add-drop filter 114 to provide the SBS laser outputs (shown in FIG. 1 as SBS1 and SBS2).

The resulting SBS laser outputs (SBS1 and SBS2) from the low-noise SBS pump laser component 110 are two SBS lasers each already comprising a very narrow line width a very stable in power. The SBS lasers act as two separate pumps for two separate frequency combs generated by the TE/TM dual comb resonator 130. The SBS1 and SBS2 are also of substantially different frequencies. As an example, in one embodiment the SBS1 laser pump has a wavelength of 1550 nm while the SBS2 laser pump has a wavelength of 1499 nm. In other embodiments, other sets of SBS1 and SBS2 lasing frequencies may be produced by the SBS pump laser component 110.

As shown in FIG. 2, the TE/TM dual comb resonator component 130 comprises a comb optical resonator 132 (such as a ring resonator or microdisk, for example) through which the output of the two SBS laser pumps (SBS1 and SBS2) are coupled into, with one propagating in the respective opposite direction than the other. In FIG. 2, SBS1 is coupled into the comb optical resonator 132 by a first coupler 134 to propagate in a clockwise direction, while SBS2 is coupled into the comb optical resonator 132 by a second coupler 133 to propagate in a counter-clockwise direction. In some embodiments, the SBS 1 and SBS2 may be coupled into their respective coupler 134 and 133 via an add-drop filter 138.

Prior to being coupled into the comb optical resonator 132, one of the generated SBS lasers (either SBS1 or SBS2) passes through a polarization rotator 135 so that the lines of the counterpropagating laser combs within the comb optical resonator 132 are also of opposing polarizations. As an example, in FIG. 2 the SBS1 laser light passes through polarization rotator 135 prior to being coupled into the comb optical resonator 132, while the SBS2 laser does not. Although the SBS1 and SBS2 are originally generated with the same (e.g., TE) polarization, then the polarization rotator with rotate the SBS1 laser to the opposite (e.g., TM) polarization. As a result, a first propagating comb (shown as Comb 1) generated in the comb optical resonator 132 from the SBS1 laser light will have a TM polarization, while the counterpropagating second comb (shown as Comb 2) generated in the comb optical resonator 132 from the SBS2 laser in the CCW direction will have a TE polarization. The two resulting combs (Comb 1 and Comb 2) will have a slightly different repetition rates because TE polarized light and TM polarized light have different group velocities, so the first and second combs they take different amounts of time to take a round trip around the comb optical resonator 132. In FIG. 1, the second comb (the CCW propagating Comb 2) exits the comb optical resonator 132 via the coupler 134, which may be the same coupler used to introduces the SBS1 light into the comb optical resonator 132. The first comb (the CW propagating Comb 1) exits the comb optical resonator 132 via the coupler 133, which may be the same coupler used to input light into the comb optical resonator 132. In this implementation, because the SBS1 laser light was the light beam shifted in polarization by the polarization rotator 135, the resulting Comb 1 output from the comb optical resonator 132 is applied to another polarization rotator 136 to place the Comb 1 and Comb 2 back into the same polarization. In other embodiments, the resulting Comb 2 output from the comb optical resonator 132 could instead be applied to a polarization rotator to place the Comb 1 and Comb 2 back into the same polarization.

For example, the TM Comb 1 exiting the comb optical resonator 132 is rotated to TE so that both Comb 1 and Comb 2 are TE polarized entering the filter resonator segment 150. Note that in other embodiments, either of the polarization rotators 135 or 136 may be placed in the waveguides to shift the polarization of either SBS1 or SBS2, or of Comb 1 or Comb 2, so long as the counter-propagating beams in the comb optical resonator 132 are of opposite polarity, and the output of the Combs from the TE/TM dual comb resonator segment 130 applied to the filter resonator segment 150 (as discussed below) are of the same polarity.

Figure 3:
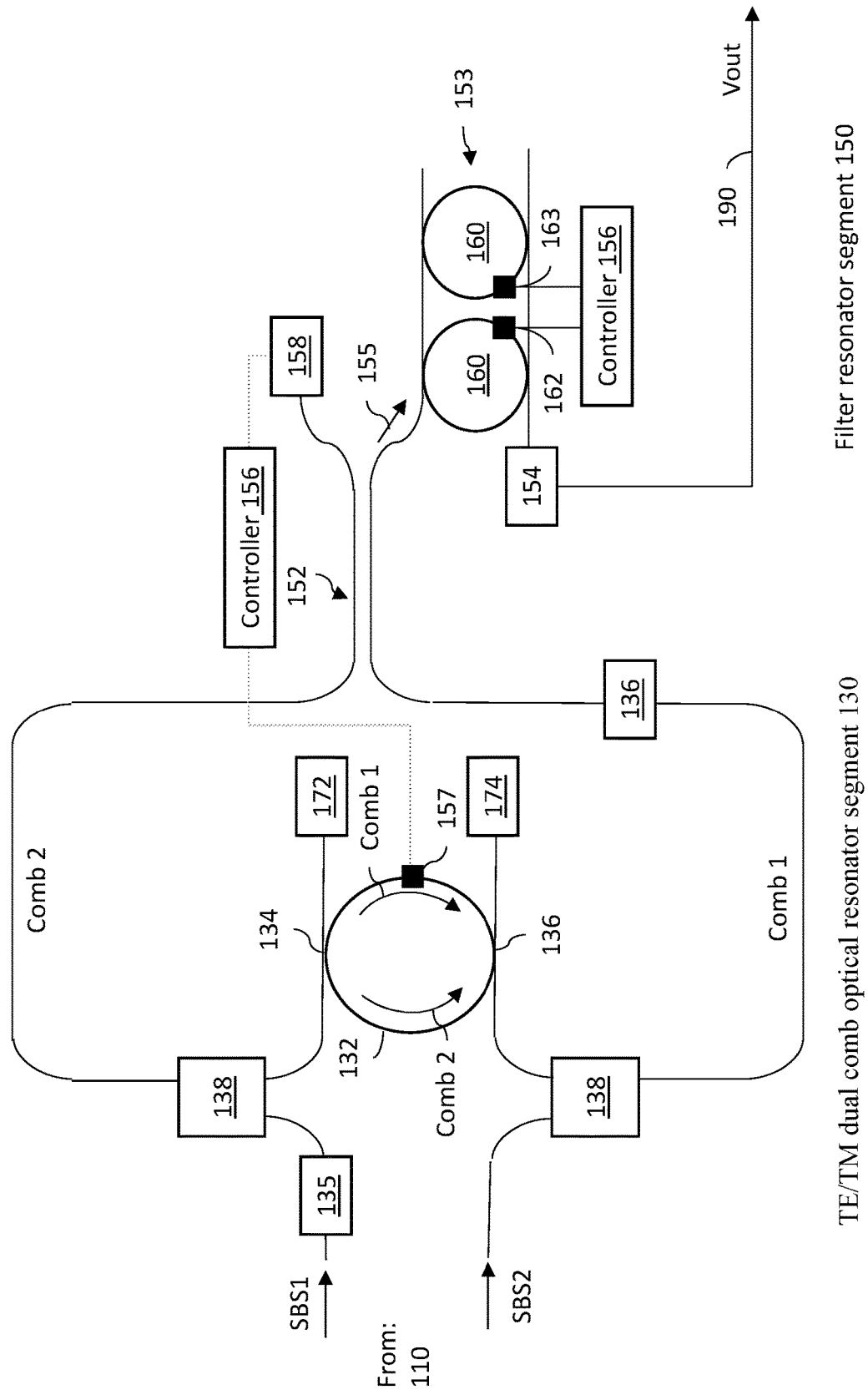
FIG. 3 is a diagram of example TE/TM dual comb optical resonator segment and Filter resonator segment for a tunable optical RF signal generator embodiment.

As illustrated in FIG. 3, in the filter resonator segment 150, Comb 1 and Comb 2 are combined into a shared waveguide using a codirectional coupler 152, so that the spectra of the two combs occupy the same spatial volume. Comb 1 and Comb 2 now combined to form a dual optical comb signal 155, one output from the codirectional coupler 152 is fed to a tunable optical filter 153 and then applied to an optical detector 154. The optical filter 153, which may comprise a vernier optical filter, is adjusted to select two lines from the dual optical comb signal 155, one from each of the Combs 1 and 2 that are closest together.

In the embodiment shown in FIG. 3, filter resonator segment 150 utilizes thermal feedback to the comb optical resonator 132 to lock the selected two lines together, either the same frequency (such that the respective selected lines are in alignment) or to a fixed frequency offset with respect to each other. In some embodiments, a controller 156 (such as a proportional-integral-derivative (PID) controller, for example) is configured to output a voltage to a microheater 157 that applies heat to the comb optical resonator 132. The dual optical comb signal 155 optical filter 153 (as measured from a output of the codirectional coupler 152) is measured an optical detector 158 that feeds a measurement of the dual optical comb signal 155 to the controller 156. The controller 156 determines and outputs the voltage applied the microheater 157 that locks the selected two comb lines together (i.e., either to the same frequency, or at a selected fixed frequency offset). By locking the selected two lines together, the comb optical resonator 132 fixes the relative positions of the Comb 1 and Comb 2.

The optical filter 153 comprises a pair of add-drop optical ring filter resonators 160, that each receive from the codirectional coupler 152 the dual optical comb signal 155. Each of the add-drop optical ring filter resonators 160 is thermally adjustable to pick-out a single line from each of the two combs present in the dual optical comb signal 155. Adjustment of the passband formed by the add-drop optical ring filter resonators 160 is controlled using one or more microheaters 162, 163 that are adjustable either through a common voltage controller (such as the controller 156), or through separate voltage controllers.

The thermal adjustment of the add-drop optical ring filter resonators 160 creates a passband that passes a pair of adjacent lines from the dual optical comb signal 155 that includes a single line from each of the Combs 1 and 2. The RF signal output 190 (shown as $V_{out}$) from the tunable optical RF signal generator 100 will vary as a function of the difference between the frequencies of the two comb lines passed by the add-drop optical ring filter resonators 160 to the optical detector 154.

Figure 4:
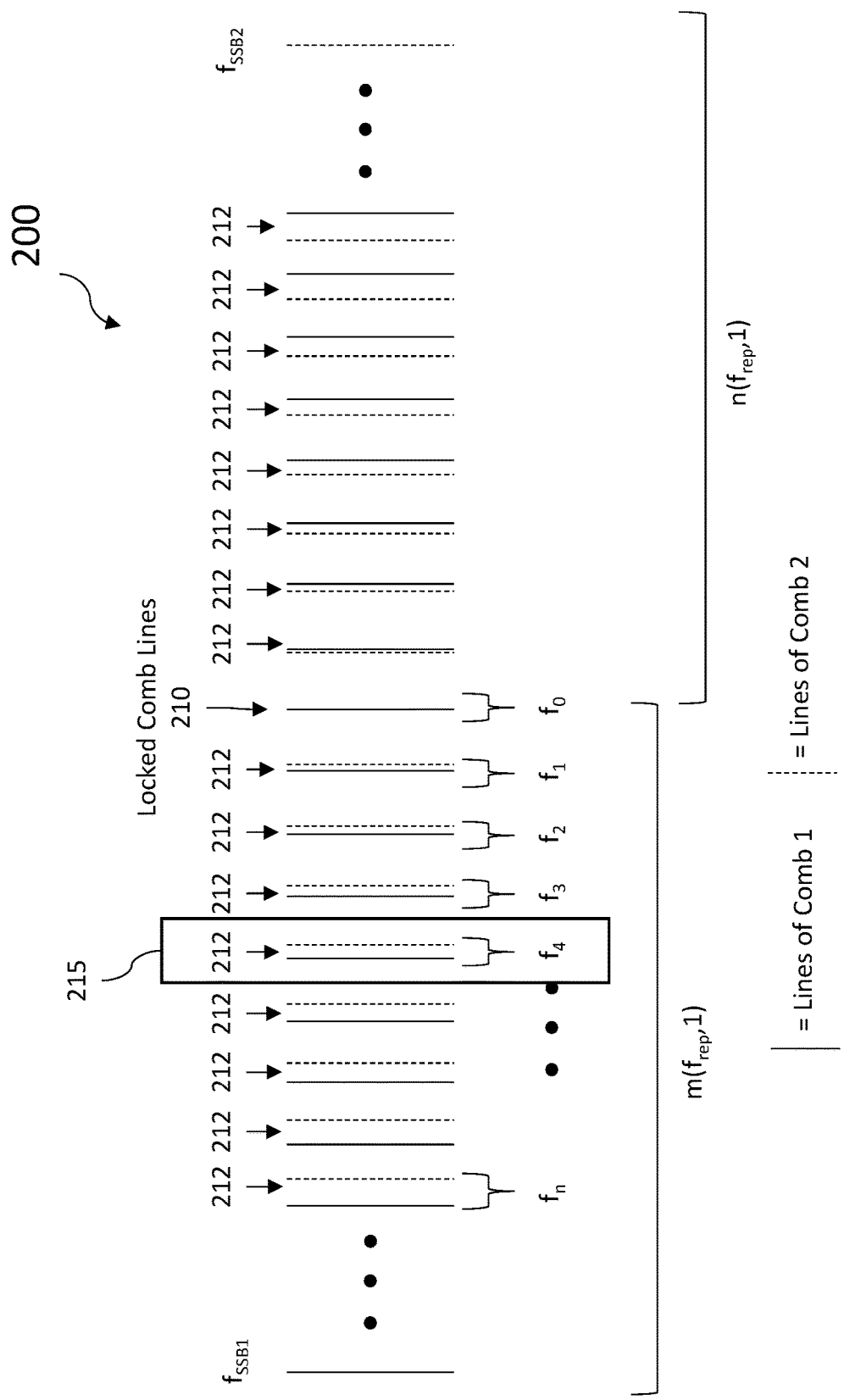
FIG. 4 is diagram illustrating an example locked optical frequency combs produced by a tunable optical RF signal generator embodiment.

Frequency tuning of the RF signal output 190 ($V_{out}$) from tunable optical RF signal generator 100 is illustrated more particularly in FIG. 4. Shown generally at 200 the Comb 1 generated from SBS laser pump 1 (shown as by solid lines) and the Comb 2 generated from the SBS laser pump 2 (shown by dashed lines) are superimposed. A selected line of Comb 1 is locked to a lines of Comb 2 as illustrated by the "locked comb lines" at 210. Through thermal feedback to the comb optical resonator 132, those two lines are locked together to either the same frequency, or to a fixed frequency offset with respect to each other. As discussed above, the FSR for light beams having TE and TM polarizations within the comb optical resonators 132 are not the same. The two combs, Comb 1 and Comb 2, therefore have slightly different line spacing in the frequency domain.

Each sequential pairing of lines 212 of the Combs 1 and 2, to either the left or right of the locked comb lines 210, comprises a uniformly increasing frequency difference between the two lines of the respective comb line pair 212. That is, the delta in frequency of the lines comprising the neighboring comb line pairs 212 will increase as there distance from the locked comb lines 210 increases (as shown at $f_0, f_1, f_2, f_3, f_4, \ldots f_n$).

Each of the ring filter resonators 160 are adjusted to pass one comb line of the adjacent comb lines pairs 212. That is, the temperatures of each of the ring filter resonators 160 is adjusted by the controller 156 to shift the effective passbands of the ring filter resonators 160 to pass the comb lines pairs 212 having a frequency difference corresponding to a desired frequency output from the optical RF signal generator 100, as shown by example in FIG. 4 at 215 where the ring filter resonators 160 are adjusted to pass the comb line pairs 212 spaced at a frequency difference of $f_4$.

For example, to obtain the frequency delta of $f_4$, one of the ring filter resonators 160 would be adjusted to pass the comb line of that comb line pair 212 produced from Comb 1. The other ring filter 160 would be adjusted to pass the line of that comb line pair 212 produced from Comb 2. The comb lines of that comb line pair 212 having a frequency delta of f1 are the only comb lines passed from the ring filter resonators 160 on to the optical detector 154 of the filter resonator segment 150 that produces the Vout electrical RS signal output for the optical RF signal generator 100.

The light incident on that optical detector 154 comprises the comb lines of that passed comb line pair 212 (which may also be called a comb "doublet"). The output Vout from the optical detector is an osculating RF electrical signal having a frequency that is a function of the difference in frequency of the light incident on the optical detector 154.

To obtain discrete tuning of the RF signal output Vout, the ring filter resonators 160 are adjusted (thermally) to control which comb line pair or doublet 212 is passed to the optical detector 154, which thus dictates corresponding difference in optical frequency observed by the optical detector 154. In some embodiments, each frequency delta of a comb line pair 212 comprises a uniform step change in frequency from the frequency delta of its neighboring comb line pair 212. For example, if the frequency delta of $f_1$ is 250 MHz, then the delta of $f_2$ will have a further uniform step of 250 MHz (i.e., $f_2$=500 MHz) and the delta of $f_3$ another further 250 of 250 MHz (i.e., $f_3$=750 MHz) and so forth. When the locked comb lines 210 are locked with an offset or bias in frequency, then the $f_1$, $f_2$, $f_3$ . . . will comprise the respective step plus that initial bias. In some embodiments, the filter resonator segment 150 may include a reference signal utilized to introduce the offset frequency between the comb lines of the locked comb lines 210 when it is desired for the locked comb lines to be locked with an offset.

The resulting Vout from the tunable optical RF signal generator 100 is an electrical oscillating frequency signal having a very low phase noise and very low comb line width. Narrow line width optical sources 111, 121 are used by the 110 the SBS pump laser segment 110 to produce SBS laser outputs SBS1 and SBS2 that pump the TE/TM dual comb resonator 130 to generate the narrow line width uniform spacing set of combs, Comb 1 and Comb 2. Comb 1 and Comb 2 are in turn used to produce a narrow line width stable RF frequency that is discretely tunable.

It should be understood that the larger the difference in the frequencies between the SBS1 and SBS2 laser pumps are, the larger the maximum delta-frequency between lines comprising the comb line pairs 212 can be, and according, the larger the largest comb line pair 212 frequency delta Fn can be. For example, when the step size is 250 MHz and it is desired for the Vout to reach 40 GHz, 160 comb line pairs 212 can be formed (i.e., n=160), from 160 comb lines of both Comb 1 and Comb 2 in the spectral region between the Locked Comb Lines 210 and frequency of the SBS1 pump laser.

Another benefit is that when the two combs, Comb 1 and Comb 2, are locked together as described above (either with or without an offset), there is a multiplicative benefit in the stability of the repetition rate of the two combs. The farther away the locked position is from the frequencies of the two pump lasers SBS1 and SBS2, the more stable the repetition rate. The more comb lines produced between either SBS pump laser frequency and the locked comb lines 210, the more stable the repetition rate will be. For example, if there are 160 comb lines produced by each comb between the SBS1 pump laser frequency and the frequency of the locked comb lines 210, and 200 comb lines produced by each comb between the SBS2 pump laser and the locked comb lines 210 frequency, then the total beneficial stability enhancement factor in the repetition rate is proportional to that sum of comb lines.

As illustrated in FIG. 2, in some embodiments, each of the two SBS pump lasers 111 an 121 optionally utilize phase modulators 170, 171 to apply a modulation to the SBS1/SBS2 laser light (at 10 MHz for example) to create a PDH loop to lock the SBS pump lasers to the comb optical resonator 132 that creates the combs. A first optical sensor 172 measures SBS1. In some embodiments, the SBS1 light may be coupled to the first optical sensor 172 from a reflection port of the coupler 134. A lock in amplifier (LIA) 173 receives the output from that first optical sensor 174 and demodulates the signal using the voltage that drove the phase modulator 170. That demodulated signal can be used by controller 156 (or other controller) to produce a first SBS control signal to control a frequency of SBS1 to keep it on a resonance with the comb optical resonator 132.

The same type of control loop may be optionally implemented to control a frequency of SBS2. That is, a second optical sensor 174 measures SBS2. In some embodiments, the SBS2 light may be coupled to the second optical sensor 174 from a reflection port of the coupler 133. A lock in amplifier (LIA) 175 receives the output from that second optical sensor 174 and demodulates the signal using the voltage that drove the phase modulator 171. That demodulated signal can be used by controller 156 (or other controller) as a second SBS control signal to control a frequency of SBS2 to keep it on a resonance with the comb optical resonator 132.

In the embodiment shown in FIG. 2, a singe reference signal 178 is supplied to drive the phase modulator 170 for SBS1 and the phase modulator 171 for SBS2. In other embodiments, separate reference signals can instead be used for each phase modulator.

With regards to manufacturing, in some embodiments the tunable optical RF signal generator 100 is fabricated on or from a substrate wafer. The substrate wafer may be comprised of, for example, silicon as its topmost layer. A layer of silicon dioxide is thermally grown on the wafer, for example 5-15 microns thick, followed by the deposition through Plasma-enhanced chemical vapor deposition (PECVD) or low pressure chemical vapor deposition (LPCVD) of some thickness of silicon nitride, for example 800 nm. The device architecture is etched into this guiding layer, for example through conventional electron-beam lithography- or photolithography-based procedures in combination with reactive ion etching. Following this, an upper cladding layer, for example silicon dioxide, may be deposited through PECVD or LPCVD. Additional steps may be included to reduce loss in the waveguide, for example annealing the sample at high temperatures after the deposition of the upper cladding, or removal of the residual resist layer following the reactive ion etch step. If different nitride thicknesses are desired for the SBS lasers as compared to the comb generating resonator, these devices may be fabricated in different layers and coupled vertically to one another.

In the fabrication of the radio frequency synthesizer, the design may include piezoelectric material (PZT) elements or other form of microheaters to control the temperature of the SBS resonators 113, the temperature of the comb-generating resonator 132 and/or the temperature of the ring filter resonators 160 of the add-drop optical ring filter resonators 160.

In some embodiments, the low-noise SBS pump laser segment 110, the TE/TM dual comb resonator 130, and the filter resonator segment 150, are each realized in a Silicon Nitride waveguide platform. However the laser light sources 111, 121 may utilize a different Silicon Nitride thickness for the waveguides than the TE/TM dual comb resonator segment 130 or the filter resonator segment 150. Accordingly, in the fabrication of the optical RF signal generator 100, a transition block may be included between waveguides of different thickness. Examples of such transition optional blocks are shown in FIG. 2 as the "vertical couplers" 180. For example the low-noise SBS pump laser segment 110 may be positioned in a layer below the TE/TM dual comb resonator 130 layer and the vertical couplers 180 function to handoff the light between the layers.

In some embodiments, the phase modulators 170, 171 are realized in a different material platform than other elements of the SBS pump laser segment 110, such as Lithium Niobate. As such, the phase modulators 170, 171 may be implemented on a different chip than used for the other components of the SBS pump laser segment 110 and the light routed between the two.

Figure 5:
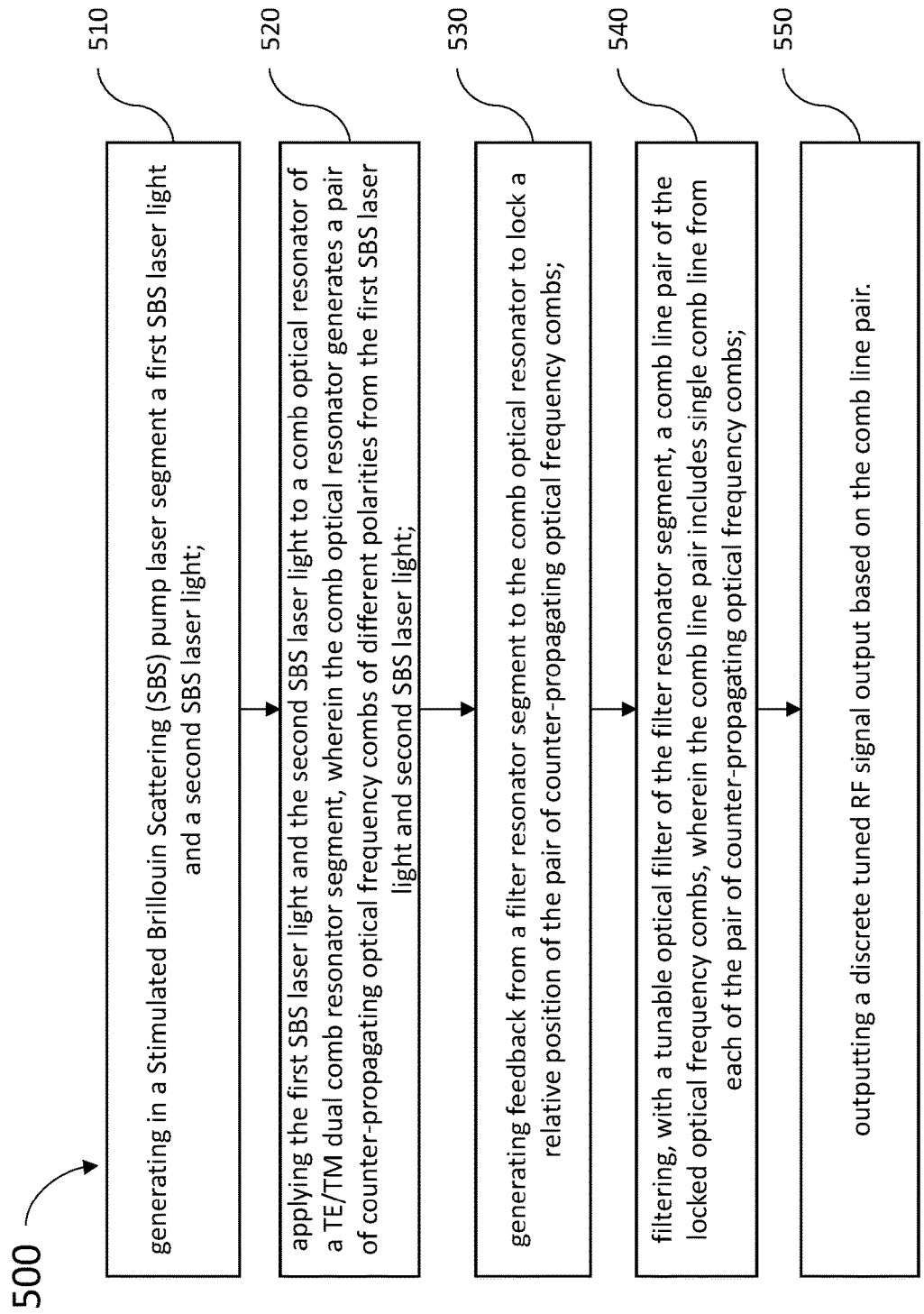
FIG. 5 is a diagram illustrating a method for generating a variable radio frequency (RF) signal utilizing an example tunable optical RF signal generator embodiment.

FIG. 5 is a flow chart diagram illustrating a method 500 of one embodiment of the present disclosure for generating a variable radio frequency (RF) signal. It should be understood that method 500 may be implemented using any one of the embodiments described above. As such, elements of method 500 may be used in conjunction with, in combination with, or substituted for elements of any of the embodiments described herein. Further, the functions, structures, features and other description of elements for such embodiments described herein may apply to like named elements of method 500 and vice versa. The method 500 beings at 510 with generating in a Stimulated Brillouin Scattering (SBS) pump laser segment a first SBS laser light and a second SBS laser light. These SBS laser light beams are generated by SBS laser sources (such as laser diodes) as previously discussed above. The method proceeds to 520 with applying the first SBS laser light and the second SBS laser light to a comb optical resonator of a TE/TM dual comb resonator segment, wherein the comb optical resonator generates a pair of counter-propagating optical frequency combs of different polarities from the first SBS laser light and second SBS laser light. The method further proceeds to 530 with generating feedback from a filter resonator segment to the comb optical resonator to lock a relative position of the pair of counter-propagating optical frequency combs. The first and second combs may be controlled to lock a selected pair of comb lines together, either at the same frequency (such that the respective selected lines are in alignment) or to a fixed frequency offset with respect to each other.

The method proceeds to 540 with filtering, with a tunable optical filter of the filter resonator segment, a comb line pair of the locked optical frequency combs, wherein the comb line pair includes single comb line from each of the pair of counter-propagating optical frequency combs. As discussed above, the filter resonator segment combines the first comb of the pair of counter-propagating optical frequency combs and the second comb of the pair of counter-propagating optical frequency combs to form a dual optical comb signal applied to the tunable optical filter. The filtered signal, now comprising a single comb line pair passed by the tunable optical filter, is fed to an optical detector that produces an electrical signal that varies as a function of the difference in frequency between the lines of the comb line pair (e.g., the associated beat frequency). The method then then proceeds to 550 with outputting a discrete tuned RF signal output based on the comb line pair.

EXAMPLE EMBODIMENTS

An optical radio frequency (RF) signal generator, the signal generator comprising: a Stimulated Brillouin Scattering (SBS) pump laser segment that includes a first SBS pump laser and a second SBS pump laser each generating SBS laser light at different respective frequencies; a TE/TM dual comb resonator segment comprising a comb optical resonator coupled to the first SBS pump laser and the second SBS pump laser, wherein the comb optical resonator segment generates a pair of counter-propagating optical frequency combs of different polarities from the SBS laser light; and a filter resonator segment configured to provide feedback to the TE/TM dual comb resonator segment to lock a relative position of the pair of counter-propagating optical frequency combs, the filter resonator segment comprising a tunable optical filter configured to output a discrete tuned RF signal output based on a comb line pair in the pair of counter-propagating optical frequency combs that includes a single comb line from each of the pair of counter-propagating optical frequency combs.

Example 2 includes the signal generator of Example 1, wherein the first SBS pump laser and the second SBS pump laser each comprise: a laser light source; a Bragg grating add-drop filter coupled to the laser light source; and a pump optical resonator coupled to the Bragg grating add-drop filter.

Example 3 includes the signal generator of any of Examples 1-2, wherein a first comb of the pair of counter-propagating optical frequency combs is transverse electric (TE) mode polarized and a second comb of the pair of counter-propagating optical frequency combs is transverse magnetic (TM) mode polarized.

Example 4 includes the signal generator of any of Examples 1-3, wherein TE/TM dual comb resonator segment comprises: a first polarization rotator configured to rotate a polarization of a first SBS laser light from the first SBS pump laser, wherein a comb optical resonator inputs the first SBS laser light with rotated polarization from the first polarization rotator; and a second polarization rotator configured to rotate a polarization of a first comb of the pair of counter-propagating optical frequency combs output from the comb optical resonator, wherein the first comb is generated within the comb optical resonator from the first SBS laser light.

Example 5 includes the signal generator of any of Examples 1-4, further comprising: a first phase modulator driven by a first voltage and configured to apply a phase modulation to a first SBS laser light from the first SBS pump laser; a first coupler configured to couple the first SBS laser light into the comb optical resonator to propagate in a first direction; a first optical sensor coupled to a reflection port of the first coupler and configured to measure the first SBS laser light; a lock in amplifier (LIA) configured to receive an output signal from the first optical sensor and demodulate the output signal using the first voltage that drove the first phase modulator; and a controller configured to receive a demodulated signal from the lock in amplifier and produce a first SBS control signal to control a frequency of the first SBS laser light to keep the first SBS laser light on a resonance frequency of the comb optical resonator.

Example 6 includes the signal generator of any of Examples 1-5, further comprising: at least one controller, wherein the controller is configured to control a heating of the tunable optical filter to adjust a passband of the tunable optical filter to select the comb line pair from the pair of counter-propagating optical frequency combs.

Example 7 includes the signal generator of Example 6, the tunable optical filter further comprising: a pair of add-drop optical ring filter resonators; and one or more microheaters coupled to the pair of add-drop optical ring filter resonators, wherein the one or more microheaters are configured to thermally control a pass band of the tunable optical filter based on a voltage signal from the controller.

Example 8 includes the signal generator of any of Examples 6-7, the filter resonator segment further comprising a codirectional coupler configured to combine a first comb of the pair of counter-propagating optical frequency combs and a second comb of the pair of counter-propagating optical frequency combs to form a dual optical comb signal applied to the tunable optical filter.

Example 9 includes the signal generator of any of Examples 6-8, the filter resonator segment further comprising: an optical detector that feeds a measurement of the dual optical comb signal to the controller; wherein the controller outputs a voltage to a microheater coupled to the comb optical resonator; wherein the microheater applies a heat to the comb optical resonator that locks the relative position of the pair of counter-propagating optical frequency combs within in the comb optical resonator.

Example 10 includes the signal generator of any of Examples 1-9, the tunable optical filter further comprising a vernier filter resonator.

Example 11 includes the signal generator of any of Examples 1-10, wherein the tunable optical RF signal generator comprises at least one layer of silicon dioxide and a layer of silicon nitride, wherein at least part of the SBS pump laser segment, the TE/TM dual comb resonator segment, or the filter resonator segment are etched into the layer of silicon nitride.

Example 12 includes a method for generating a variable radio frequency (RF) signal, the method comprising: generating in a Stimulated Brillouin Scattering (SBS) pump laser segment a first SBS laser light and a second SBS laser light; applying the first SBS laser light and the second SBS laser light to a comb optical resonator of a TE/TM dual comb resonator segment, wherein the comb optical resonator generates a pair of counter-propagating optical frequency combs of different polarities from the first SBS laser light and second SBS laser light; generating feedback from a filter resonator segment to the comb optical resonator to lock a relative position of the pair of counter-propagating optical frequency combs; filtering, with a tunable optical filter of the filter resonator segment, a comb line pair of the locked optical frequency combs, wherein the comb line pair includes single comb line from each of the pair of counter-propagating optical frequency combs; and outputting a discrete tuned RF signal output based on the comb line pair.

Example 13 includes the method of Example 12, wherein SBS pump laser segment comprises a first SBS pump laser and a second SBS pump laser that each comprise: a laser light source; a Bragg grating add-drop filter coupled to the laser light source; and a pump optical resonator couple to the Bragg grating add-drop filter.

Example 14 includes the method of any of Examples 12-13, wherein a first comb of the pair of counter-propagating optical frequency combs is transverse electric (TE) mode polarized and a second comb of the pair of counter-propagating optical frequency combs is transverse magnetic (TM) mode polarized.

Example 15 includes the method of any of Examples 12-14, wherein TE/TM dual comb resonator segment comprises: a first polarization rotator configured to rotate a polarization of the first SBS laser light from a first SBS pump laser, wherein the comb optical resonator inputs the first SBS laser light with rotated polarization from the first polarization rotator; and a second polarization rotator configured to rotate a polarization of a first comb of the pair of counter-propagating optical frequency combs output from the comb optical resonator, wherein the first comb is generated within the comb optical resonator from the first SBS laser light.

Example 16 includes the method of any of Examples 12-15, further comprising: applying a phase modulation to a first SBS laser light from the first SBS pump laser; coupling with a first coupler the first SBS laser light into the comb optical resonator to propagate in a first direction; measuring with a first optical sensor coupled to a reflection port of the first coupler the first SBS laser light; demodulating an output signal from the first optical sensor using a first voltage that drove the phase modulation to produce a first SBS control signal; and controlling a frequency of the first SBS laser light to keep the first SBS laser light on a resonance frequency of the comb optical resonator based on the first SBS control signal.

Example 17 includes the method of any of Examples 12-16, further comprising: controlling a heating of the tunable optical filter to adjust a passband of the tunable optical filter to select the comb line pair from the pair of counter-propagating optical frequency combs.

Example 18 includes the method of any of Examples 12-17, the tunable optical filter further comprising: a pair of add-drop optical ring filter resonators; and one or more microheaters coupled to the pair of add-drop optical ring filter resonators, wherein the one or more microheaters are configured to thermally control a pass band of the tunable optical filter based on a voltage signal from a controller.

Example 19 includes the method of any of Examples 12-18, further comprising: combining with a codirectional coupler a first comb of the pair of counter-propagating optical frequency combs and a second comb of the pair of counter-propagating optical frequency combs to form a dual optical comb signal applied to the tunable optical filter.

Example 20 includes the method of any of Examples 12-19, the filter resonator segment further comprising: an optical detector that feeds a measurement of the dual optical comb signal to a controller; wherein the controller outputs a voltage to a microheater coupled to the comb optical resonator; wherein the microheater applies a heat to the comb optical resonator that locks the relative position of the pair of counter-propagating optical frequency combs within in the comb optical resonator.

In various alternative embodiments, system and/or device elements, method steps, or example implementations described throughout this disclosure (such as any of the SBS pump laser segment, TE/TM dual comb optical resonator segment, Filter resonator segment, or any controllers, processors, circuits, or sub-parts thereof, for example) may be implemented at least in part using one or more computer systems, field programmable gate arrays (FPGAs), or similar devices comprising a processor coupled to a memory and executing code to realize those elements, processes, or examples, said code stored on a non-transient hardware data storage device. Therefore, other embodiments of the present disclosure may include elements comprising program instructions resident on computer readable media which when implemented by such computer systems, enable them to implement the embodiments described herein. As used herein, the term "computer readable media" refers to tangible memory storage devices having non-transient physical forms. Such non-transient physical forms may include computer memory devices, such as but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device having a physical, tangible form. Program instructions include, but are not limited to computer-executable instructions executed by computer system processors and hardware description languages such as Very High Speed Integrated Circuit (VHSIC) Hardware Description Language (VHDL).

As used herein, terms such as SBS pump laser segment, TE/TM dual comb optical resonator segment, Filter resonator segment, lasers, laser source, resonator, ring resonator, optical detector, controller, waveguide, coupler, add-drop filter, optical comb, amplifier, refer to the names of elements that would be understood by those of skill in the art and are not used herein as nonce words or nonce terms for the purpose of invoking 35 USC 112(f).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. An optical radio frequency (RF) signal generator, the signal generator comprising:
   a Stimulated Brillouin Scattering (SBS) pump laser segment that includes a first SBS pump laser and a second SBS pump laser each generating SBS laser light at different respective frequencies;
   a transverse electric/transverse magnetic (TE/TM) dual comb resonator segment comprising a comb optical resonator coupled to the first SBS pump laser and the second SBS pump laser, wherein the comb optical resonator generates a pair of counter-propagating optical frequency combs of different polarities from the SBS laser light; and
   a filter resonator segment configured to provide feedback to the TE/TM dual comb resonator segment to lock a relative position of the pair of counter-propagating optical frequency combs, the filter resonator segment comprising a tunable optical filter configured to output a discrete tuned RF signal output based on a comb line pair in the pair of counter-propagating optical frequency combs that includes a single comb line from each of the pair of counter-propagating optical frequency combs.

2. The signal generator of claim 1, wherein the first SBS pump laser and the second SBS pump laser each comprise:
   a laser light source;
   a Bragg grating add-drop filter coupled to the laser light source; and
   a pump optical resonator coupled to the Bragg grating add-drop filter.

3. The signal generator of claim 1, wherein a first comb of the pair of counter-propagating optical frequency combs is TE mode polarized and a second comb of the pair of counter-propagating optical frequency combs is TM mode polarized.

4. The signal generator of claim 1, wherein the TE/TM dual comb resonator segment comprises:
   a first polarization rotator configured to rotate a polarization of a first SBS laser light from the first SBS pump laser, wherein a comb optical resonator inputs the first SBS laser light with rotated polarization from the first polarization rotator; and
   a second polarization rotator configured to rotate a polarization of a first comb of the pair of counter-propagating optical frequency combs output from the comb optical resonator, wherein the first comb is generated within the comb optical resonator from the first SBS laser light.

5. The signal generator of claim 1, further comprising:
   a first phase modulator driven by a first voltage and configured to apply a phase modulation to a first SBS laser light from the first SBS pump laser;
   a first coupler configured to couple the first SBS laser light into the comb optical resonator to propagate in a first direction;
   a first optical sensor coupled to a reflection port of the first coupler and configured to measure the first SBS laser light;
   a lock in amplifier (LIA) configured to receive an output signal from the first optical sensor and demodulate the output signal using the first voltage that drove the first phase modulator; and
   a controller configured to receive a demodulated signal from the lock in amplifier and produce a first SBS control signal to control a frequency of the first SBS laser light to keep the first SBS laser light on a resonance frequency of the comb optical resonator.

6. The signal generator of claim 1, further comprising:
   at least one controller, wherein the at least one controller is configured to control a heating of the tunable optical filter to adjust a passband of the tunable optical filter to select the comb line pair from the pair of counter-propagating optical frequency combs.

7. The signal generator of claim 6, the tunable optical filter further comprising:
   a pair of add-drop optical ring filter resonators; and
   one or more microheaters coupled to the pair of add-drop optical ring filter resonators, wherein the one or more microheaters are configured to thermally control a pass band of the tunable optical filter based on a voltage signal from the at least one controller.

8. The signal generator of claim 6, the filter resonator segment further comprising a codirectional coupler configured to combine a first comb of the pair of counter-propagating optical frequency combs and a second comb of the pair of counter-propagating optical frequency combs to form a dual optical comb signal applied to the tunable optical filter.

9. The signal generator of claim 6, the filter resonator segment further comprising:
   an optical detector that feeds a measurement of the dual optical comb signal to the at least one controller;
   wherein the at least one controller outputs a voltage to a microheater coupled to the comb optical resonator; wherein the microheater applies a heat to the comb optical resonator that locks the relative position of the pair of counter-propagating optical frequency combs within in the comb optical resonator.

10. The signal generator of claim 1, the tunable optical filter further comprising a vernier filter resonator.

11. The signal generator of claim 1, wherein the tunable optical RF signal generator comprises at least one layer of silicon dioxide and a layer of silicon nitride, wherein at least part of the SBS pump laser segment, the TE/TM dual comb resonator segment, or the filter resonator segment are etched into the layer of silicon nitride.

12. A method for generating a variable radio frequency (RF) signal, the method comprising:
   generating in a Stimulated Brillouin Scattering (SBS) pump laser segment a first SBS laser light and a second SBS laser light;
   applying the first SBS laser light and the second SBS laser light to a comb optical resonator of a transverse electric/transverse magnetic (TE/TM) dual comb resonator segment, wherein the comb optical resonator generates a pair of counter-propagating optical frequency combs of different polarities from the first SBS laser light and the second SBS laser light;
   generating feedback from a filter resonator segment to the comb optical resonator to lock a relative position of the pair of counter-propagating optical frequency combs;
   filtering, with a tunable optical filter of the filter resonator segment, a comb line pair of the locked optical frequency combs, wherein the comb line pair includes single comb line from each of the pair of counter-propagating optical frequency combs; and
   outputting a discrete tuned RF signal output based on the comb line pair.

13. The method of claim 12, wherein SBS pump laser segment comprises a first SBS pump laser and a second SBS pump laser that each comprise:
   a laser light source;
   a Bragg grating add-drop filter coupled to the laser light source; and
   a pump optical resonator couple to the Bragg grating add-drop filter.

14. The method of claim 12, wherein a first comb of the pair of counter-propagating optical frequency combs is TE mode polarized and a second comb of the pair of counter-propagating optical frequency combs is TM mode polarized.

15. The method of claim 12, wherein TE/TM dual comb resonator segment comprises:
   a first polarization rotator configured to rotate a polarization of the first SBS laser light from a first SBS pump laser, wherein the comb optical resonator inputs the first SBS laser light with rotated polarization from the first polarization rotator; and
   a second polarization rotator configured to rotate a polarization of a first comb of the pair of counter-propagating optical frequency combs output from the comb optical resonator, wherein the first comb is generated within the comb optical resonator from the first SBS laser light.

16. The method of claim 12, further comprising:
   applying a phase modulation to the first SBS laser light from a first SBS pump laser;
   coupling with a first coupler the first SBS laser light into the comb optical resonator to propagate in a first direction;
   measuring with a first optical sensor coupled to a reflection port of the first coupler the first SBS laser light;
   demodulating an output signal from the first optical sensor using a first voltage that drove the phase modulation to produce a first SBS control signal; and
   controlling a frequency of the first SBS laser light to keep the first SBS laser light on a resonance frequency of the comb optical resonator based on the first SBS control signal.

17. The method of claim 12, further comprising:
   controlling a heating of the tunable optical filter to adjust a passband of the tunable optical filter to select the comb line pair from the pair of counter-propagating optical frequency combs.

18. The method of claim 12, the tunable optical filter further comprising:
   a pair of add-drop optical ring filter resonators; and
   one or more microheaters coupled to the pair of add-drop optical ring filter resonators, wherein the one or more microheaters are configured to thermally control a pass band of the tunable optical filter based on a voltage signal from a controller.

19. The method of claim 12, further comprising:
   combining with a codirectional coupler a first comb of the pair of counter-propagating optical frequency combs and a second comb of the pair of counter-propagating optical frequency combs to form a dual optical comb signal applied to the tunable optical filter.

20. The method of claim 19, the filter resonator segment further comprising:
   an optical detector that feeds a measurement of the dual optical comb signal to a controller;
   wherein the controller outputs a voltage to a microheater coupled to the comb optical resonator; wherein the microheater applies a heat to the comb optical resonator that locks the relative position of the pair of counter-propagating optical frequency combs within in the comb optical resonator.

* * * * *